(12) United States Patent
Iwai et al.

(10) Patent No.: US 8,110,965 B2
(45) Date of Patent: Feb. 7, 2012

(54) PIEZOELECTRIC DEVICES HAVING IMPROVED IMPACT RESISTANCE

(75) Inventors: Hiroki Iwai, Saitama (JP); Yu Iwai, Saitama (JP); Hiroshi Uehara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 323 days.

(21) Appl. No.: 12/564,846

(22) Filed: Sep. 22, 2009

(65) Prior Publication Data

US 2010/0079040 A1 Apr. 1, 2010

(30) Foreign Application Priority Data

Sep. 29, 2008 (JP) ................. 2008-251182

(51) Int. Cl.
*H03H 9/19* (2006.01)
*H03H 9/21* (2006.01)
*H03H 9/215* (2006.01)
(52) U.S. Cl. ..................... 310/370; 310/344
(58) Field of Classification Search .......... 310/370, 310/344, 348
See application file for complete search history.

(56) References Cited

U.S. PATENT DOCUMENTS

| 7,015,631 | B2 * | 3/2006 | Hirasawa et al. | 310/370 |
| 2003/0168943 | A1 * | 9/2003 | Matsuyama et al. | 310/344 |
| 2009/0015106 | A1 * | 1/2009 | Tanaya | 310/344 |
| 2011/0068876 | A1 * | 3/2011 | Yamada et al. | 331/158 |

FOREIGN PATENT DOCUMENTS

| JP | 2001-007678 | | 1/2001 |
| JP | 2007258918 A | * | 10/2007 |
| JP | 2008219396 A | * | 9/2008 |
| JP | 2009118302 A | * | 5/2009 |
| JP | 2010283804 A | * | 12/2010 |

* cited by examiner

*Primary Examiner* — Jaydi San Martin
(74) *Attorney, Agent, or Firm* — Klarquist Sparkman, LLP

(57) ABSTRACT

An exemplary piezoelectric vibrating device has a lid plate, a chip plate including a tuning-fork type vibrating piece surrounded by an outer frame, and a package base arranged where the chip plate is sandwiched between the lid plate and package base, and the three layers are bonded together. The tuning-fork type piezoelectric vibrating piece is connected to the outer frame by supporting arms. A base-movement buffer having a predetermined height in the X-direction extends from the inner edge surface of the outer frame toward a side edge of the base. The base-movement buffer has a height in the X-direction that is proportional to the length from the base-movement buffer to a point at which the tuning-fork type piezoelectric vibrating piece is coupled to the outer frame.

20 Claims, 6 Drawing Sheets

PIEZOELECTRIC DEVICES HAVING IMPROVED IMPACT RESISTANCE

CROSS-REFERENCE TO RELATED APPLICATION

This application claims priority to and the benefit of Japan Patent Application No. 2008-251182, filed on Sep. 29, 2008, in the Japan Patent Office, the disclosure of which is incorporated herein by reference in its entirety.

FIELD

This disclosure relates to, inter alia, piezoelectric devices configured to resist breakage caused by physical impact, such as encountered whenever the device is dropped.

DESCRIPTION OF THE RELATED ART

In small data devices, such as HDDs (Hard Disc Drives), mobile computers, IC cards, or clock sources for mobile phones, piezoelectric devices are often used.

Example piezoelectric devices include piezoelectric vibrating pieces and piezoelectric oscillators. A conventional piezoelectric device as described in Japan Unexamined Patent Application No. JP2001-007678 is shown in FIG. 6. The depicted piezoelectric device 90 comprises a piezoelectric vibrating piece having a pair of vibrating arms 91 and a base 92. The piezoelectric vibrating piece is sealed within a package by a lid (not shown). The piezoelectric vibrating piece of FIG. 6 also includes an outer frame 93 that surrounds the vibrating arms 91 and base 92.

Whenever an impact force F is applied to a piezoelectric vibrating piece, such as by dropping, the piezoelectric vibrating piece deforms in the direction exemplified by the two-headed arrow. During such deformation, the base 92 behaves as a fulcrum relative to which the distal tips of vibrating arms 91 move and collide with the outer frame 93. This collision usually causes breakage or deformation of the piezoelectric vibrating piece and also adversely affects the CI value or the oscillation frequency of the piece.

One approach to protecting against breakage or deformation of the piezoelectric vibrating piece caused by physical impact is discussed in Japan Unexamined Patent Application No. JP2001-007678 and shown in FIG. 6. Specifically, the outer frame 93 includes wider regions 94 near the distal ends of the vibrating arms 91. Whenever the piezoelectric vibrating piece is deflected in the direction indicated by the double-headed arrow by dropping or the like, the vibrating arms 91 contact the sides of the wider regions 94. I.e., the wider regions 94 limit the degree of swing of the vibrating arms toward the outer frame 93, which helps prevent breakage or deformation of the vibrating arms 91.

However, during a physical impact as discussed above, acceleration of the vibrating arms 91 relative to the base 92 (serving as a fulcrum) is greatest at the most distal ends of the vibrating arms 91. Since the base 92 behaves as a fulcrum, the most distal ends of the vibrating arms 91, which are very fragile, are most vulnerable to collisions with the outer frame 93.

Piezoelectric vibrating devices are subject to miniaturization activity as are other electronic devices. I.e., as electronic devices are further miniaturized, piezoelectric devices mounted on them also must be miniaturized. To achieve further miniaturization of a piezoelectric vibrating piece, the vibrating arms 91 are often provided with respective supporting arms. The supporting arms usually extend outboard of and parallel to the vibrating arms 91. Use of supporting arms provide piezoelectric devices with greater impact resistance, even after being miniaturized.

SUMMARY

An object of the present invention is to provide piezoelectric devices that sufficiently and securely prevent breakage or deformation of portions thereof caused by physical impact to (e.g., dropping of) the device, even after the device has been miniaturized. To such end, several aspects of the invention are disclosed herein.

According to a first aspect, piezoelectric device are provided, of which an embodiment comprises a lid plate, a chip plate, and a package base plate. The chip plate includes a tuning-fork type piezoelectric vibrating piece and an outer frame surrounding the tuning-fork type piezoelectric vibrating piece. The lid plate and package base plate are arranged with the chip plate sandwiched therebetween, and bonded together. The tuning-fork type piezoelectric vibrating piece comprises a base and at least a pair of vibrating arms extending in a designated longitudinal (Y-direction herein) direction from one edge of the base.

The piezoelectric device can be considered as having a width in the X-direction, a length in the Y-direction, and a thickness in the Z-direction. The vibrating arms extend lengthwise in the Y-direction (longitudinal direction). The tuning-fork type piezoelectric vibrating piece is coupled to the outer frame by a pair of supporting arms situated outboard of and parallel to the vibrating arms. At least one base-movement "buffer" extends in the X-direction from an inner edge surface of the outer frame toward the base. The base-movement buffer has a designated "height" in the X-direction, wherein this height is proportional to a distance from the base-movement buffer to an X-direction line denoting a point of connection of the tuning-fork type piezoelectric vibrating piece to the outer frame.

As noted, whenever an impact force caused by dropping or the like is applied to the piezoelectric vibrating piece, the vibrating arms and base of the piezoelectric vibrating piece react to the impact by pivoting laterally about a point relative to the outer frame. The base-movement buffer limits the degree of this motion and thus reduces the intensity of collisions of the vibrating arms with the outer frame. For example, the base-movement buffer prevents the most distal ends of the vibrating arms, which are easily chipped during collision, from colliding with the buffer portion or any other structure so that fracture of the piezoelectric vibrating piece is reduced or prevented entirely.

In one embodiment, the base-movement buffer is situated (e.g., on the inner edge surface of the outer frame) to prevent the most distal regions of the base from colliding with the buffer. Thus, in an impact situation, breakage and deformation of the piezoelectric vibrating piece are prevented. In other words, as the base-movement buffer does not contact the vibrating arms, damage to the vibrating arms can be reduced. In particular, if a buffer contacts with the vibrating arms, the electrode film may be grinded and that may cause frequency shift or CI value.

In another embodiment the piezoelectric vibrating device further comprises a supporting-arm-movement buffer having a constant height in the X-direction. The supporting-arm-movement buffer extends from a location on the inner edge surface of the outer frame toward a respective supporting arm. During a physical impact, the piezoelectric vibrating piece responds often by rotating relative to the outer frame, due to flexibility of the supporting arms. The supporting-arm-movement buffer limits this motion and thereby reduces the probability of the piezoelectric vibrating piece experiencing damage during or as a result of the impact.

The "top" surface (extending substantially in the Y-direction) of a base-movement buffer and/or supporting-arm-movement buffer can have any of various plan profiles (viewed from a location in the Z-direction). For example, the buffer can have a trapezoidal, rectangular, or semicircular profile. The top surface of the trapezoidal or rectangular buffer can be tilted or sloped to increase the surface area of contact of the top surface with the adjacent surface (e.g., of the base or supporting arm).

Another embodiment of a piezoelectric device comprises a lid plate, a package base plate, and a chip plate comprising a tuning-fork type piezoelectric vibrating piece and an outer frame surrounding the tuning-fork type piezoelectric vibrating piece. The lid plate, chip plate, and package base plate are bonded together as a package containing the piezoelectric vibrating piece inside the package. The tuning-fork type piezoelectric vibrating piece comprises a base having an X-direction width and at least a pair of vibrating arms extending in a Y-direction from the base. The tuning-fork type piezoelectric vibrating piece is coupled to the outer frame by a pair of supporting arms situated outboard of the vibrating arms. The base includes a side edge surface from which at least one base-movement buffer (having a height in the X-direction) extends in the X-direction toward the outer frame. The height of the base-movement buffer in the X-direction is proportional to the distance from the base-movement buffer to an X-direction line denoting a point of connection of the piezoelectric vibrating piece to the outer frame. Since the base-movement buffer is situated on the side edge of the base, the mass of the base is increased compared to configurations in which the buffer is located on the outer frame. This increased mass of the base inhibits leakage of vibration oscillation to the exterior of the piezoelectric device, which reduces the adverse consequences of physical impacts such as from dropping the device.

Some embodiments have, either in place of or in addition to the base-movement buffer, a supporting-arm-movement buffer having a constant height in the X-direction. This supporting-arm-movement buffer is extends from an inner edge surface (extending in the Y-direction) of the outer frame toward a respective supporting arm. Located in this manner, the supporting-arm-movement buffer does not adversely affect the vibration frequency or CI value of the piezoelectric vibrating piece. Even if one or both the supporting arms and/or respective buffers becomes chipped or otherwise damaged, the vibration frequency and CI value of the piezoelectric vibrating piece are maintained. Desirably, the supporting arms are located at or near an axis about which the piezoelectric vibrating piece pivots relative to the outer frame in response to receiving a physical impact. By locating the supporting arms in this way, acceleration of the piezoelectric vibrating piece during such pivoting motion is minimized, which reduces or inhibits breakage caused by impact forces and correspondingly increases the usable life of the piezoelectric vibrating piece.

In other embodiments a supporting-arm-movement buffer (having a constant height in the X-direction) extends from the respective edge surface of a respective supporting arm. The edge surface extends in the Y-direction (longitudinal direction) and the buffer extends in the X-direction from the edge surface. Having such a location opposite the respective supporting arm, the buffer does not adversely affect vibration frequency and CI value of the piezoelectric vibrating piece. Even if the supporting arm or associated buffer becomes chipped or otherwise fractured, the vibration frequency and CI value of the piezoelectric vibrating piece do not significantly change. The supporting arms are located near the pivot axis of the piezoelectric vibrating piece relative to the frame. Thus, acceleration accompanied by motion about the pivot axis is minimized, thereby reducing the probability of breakage by impact, reducing the impact force, and increasing the useful life of the piezoelectric vibrating piece.

Desirably, the X-direction height of the base-movement buffer is proportional to a distance from the base-motion buffer to a point at which the tuning-fork type piezoelectric vibrating piece and outer frame are coupled to each other. This configuration effectively reduces the probability of fracture of the piezoelectric vibrating piece.

If included, the supporting-arm-movement buffer (having a constant height in the X-direction) extends from an inside edge surface of the outer frame corresponding to the supporting arms in the Y-direction (longitudinal direction). The vibrating-arm-movement buffer portion can be formed while protecting the distal ends of the vibrating arms that are most important for maintaining the designated vibration frequency of the piezoelectric vibrating piece.

Regarding the piezoelectric vibrating piece, the "height" of the base-movement buffer in the X-direction desirably is proportional to a distance from the buffer to a point of connection of the tuning-fork type piezoelectric vibrating piece with the outer frame. The "height" of the supporting-arm-movement buffer portion is also desirably proportional to the distance between the buffer and the point of connection. Adherence to these proportions effectively prevents breakage of the piezoelectric vibrating piece upon subjecting it to a physical impact.

The base-movement buffer desirably is located so as to prevent it from contacting the distal-most end of the base. As a result, the distal-most end does not collide with the buffer, which prevents breakage or deformation of the piezoelectric vibrating piece.

As noted, any of the various buffers can have a rectangular, trapezoidal, or semicircular plan profile. More desirably, the plan profile is trapezoidal or semicircular. The "top" surface of a buffer can be (and desirably is) sloped at an angle substantially equal to the angle of the surface contacted by the top surface during an impact event. A sloped top surface is particularly advantageous in base-movement buffers. The sloped surface allows the piezoelectric vibrating piece to contact the buffer over a larger area than a point or line, which distributes impact stresses and reduces the probability of breakage of the buffer.

According to the present invention, even though a packaged piezoelectric vibrating piece may experience a physical impact, selected portion(s) of the piezoelectric vibrating piece (e.g., a distal end thereof) can collide with the outer frame and not experience breakage or deformation. This is achieved by providing one or more buffers as described herein.

DETAILED DESCRIPTION

The present invention is described below with reference to the appended drawings.

First Embodiment

Figure 1:
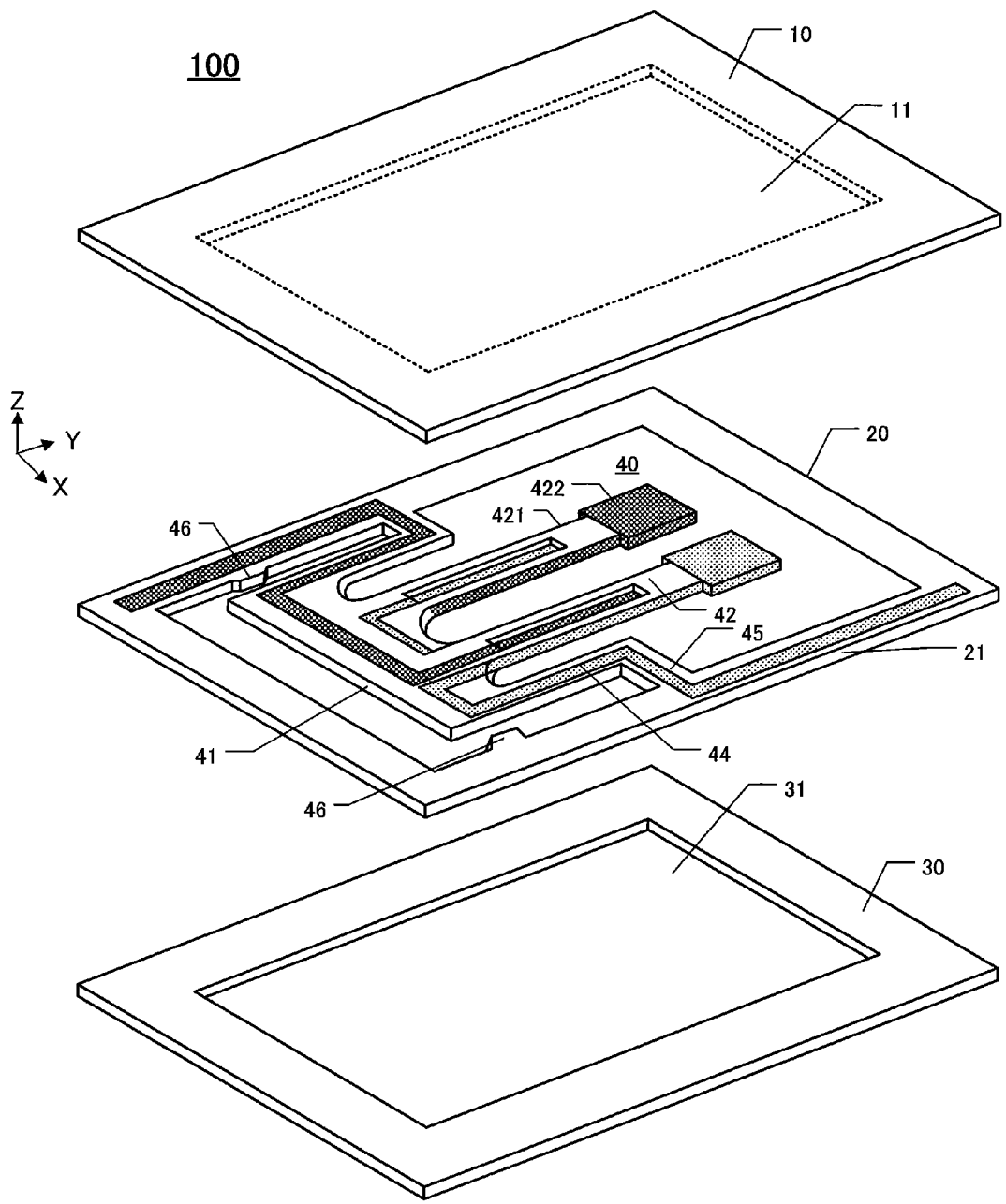
FIG. 1 is a perspective exploded view of a first embodiment of a piezoelectric vibrator.

FIG. 1 is a perspective exploded view of the first embodiment 100 of a piezoelectric vibrator. A "piezoelectric vibrator" is a device including a "chip plate," a package lid (or "lid plate"), and a package base (or "base plate"). The chip plate is sandwiched between the package lid and package base, which are bonded together to form a packaged device. The chip plate includes a "piezoelectric vibrating piece" which exhibits vibrational behavior when appropriately electrically energized. FIG. 1 shows the package lid 10, the chip plate 20, and the package base 30. The package base 30 is situated under the chip plate 20, and the package lid 10 is situated above the chip plate. Thus, the chip plate 20 is sandwiched between the package lid 10 and package base 30. Bonding of these three plates together can be performed by, for example, siloxane bonding (Si—O—Si) or anodic bonding.

The package lid 10 desirably comprises a concavity 11 formed by etching into the surface facing the chip plate 20. The chip plate 20 comprises a piezoelectric vibrating piece 40 situated substantially at the center of the chip plate. The chip plate 20 also includes an outer frame 21 that surrounds the piezoelectric vibrating piece 40. In this embodiment the piezoelectric vibrating piece 40 is a very small tuning-fork type piezoelectric vibrating piece that, by way of example, oscillates at a frequency of 32.768 kHz.

In FIG. 1, an exemplary Cartesian coordinate system is shown on the left side of the drawing. In this coordinate system, "length" or "longitudinal direction" is in the Y-direction, "width" is in the X-direction, and thickness is in the Z-direction. In certain contexts and referring to certain views (e.g., plan view), "height" refers to a dimension in the X-direction. Note that any two axes (e.g., X- and Y-directions) define a respective plane.

The piezoelectric vibrating piece 40 comprises a base 41, a pair of vibrating arms 42 that extend from the base 41 in a designated direction (here, the Y-direction), and a pair of supporting arms 44 extending parallel to but outboard of the vibrating arms 42. The supporting arms 44 couple the base 41 to the outer frame 21. Each vibrating arm 42 comprises a tine 421 that extends from the base 41 and a hammer-head portion 422 situated on the distal end of the tine 421. The hammer-head portion 422 has a greater width (X-direction) than the tine 421.

Each vibrating arm 42 also comprises respective electrodes formed by vacuum evaporation or sputtering on each of the upper, lower, and side surfaces of the vibrating arm, as well as on the base 41. For example, each electrode has a two-layer structure in which an Au layer of 400 to 2000 Ångstroms thickness is formed on a sub-layer of Cr of 150 to 700 Ångstroms. Titanium (Ti) can be used instead of chrome (Cr) for the sub-layer, and silver (Ag) can be used instead of gold (Au) for the top layer. As an alternative to this two-layer structure, each electrode can be formed of an alloy of aluminum and copper (the latter as the main component) to obtain favorable adhesion, corrosion resistance, electrical conductivity, and heat resistance.

The supporting arms 44 extend in the Y-direction from respective ends of the base 41. I.e., the supporting arms 44 are parallel to the vibrating arms 42. Each supporting arm 44 includes a connecting portion 45 that extends in the X-direction to a respective location on the outer frame 21. The supporting arms 44 are configured to prevent or inhibit conduction of vibrations from the vibrating arms 42 to outside the piezoelectric device 100. The supporting arms 44 also reduce adverse influences of changes in external temperature and/or physical impacts caused by, for example, dropping the piezoelectric device.

The package base 30 desirably comprises a concavity 31 that faces the chip plate 20. The package base 30 can include through holes or external electrodes for electrical connection.

Figure 2A:
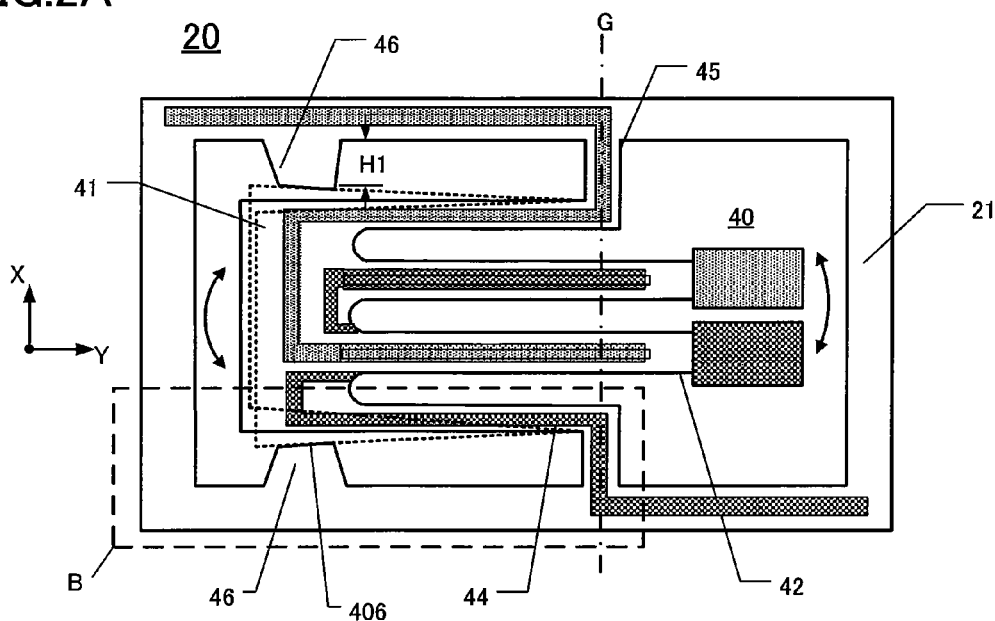
FIG. 2A is a plan view of the chip plate of the embodiment of FIG. 1.
Figure 2B:
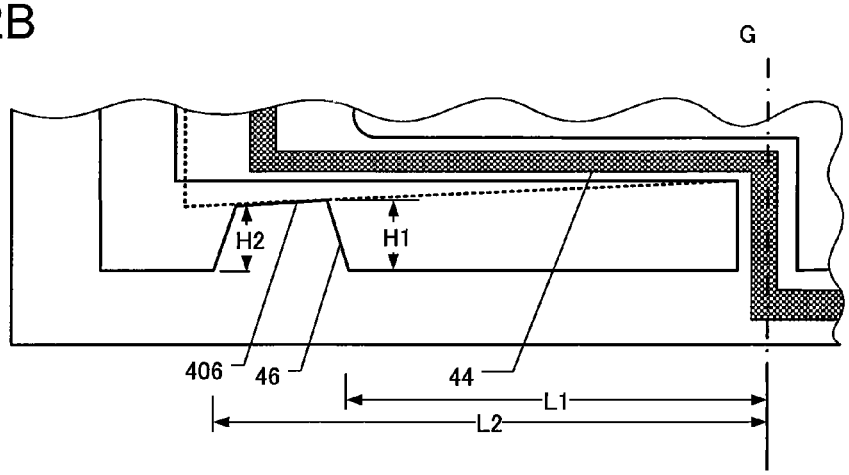
FIG. 2B is an enlarged view of the region in FIG. 2A located within the dashed lines B.

FIG. 2A is a plan view of the chip plate 20 including the piezoelectric vibrating piece 40. FIG. 2B is an enlargement of the region denoted "B" in FIG. 2A. As shown in FIG. 2A, the inside surfaces of the longitudinal edges of the outer frame 21 include trapezoidal extensions 46 situated near respective regions of the base 41. The dimensions of the extensions 46 in the X-direction are within a range ensuring that the extensions 46 do not interfere with regular oscillation of the piezoelectric vibrating piece 40. Thus, the extensions 46 serve as "movement buffers" that prevent excessive motion of the piezoelectric vibrating piece relative to the outer frame during a physical shock or impact situation to the package.

The piezoelectric vibrating piece 40 is coupled to the outer frame 21 of the chip plate 20 via the connecting portions 45. Whenever the piezoelectric vibrating device 100 experiences a physical impact or shock such as dropping the device on a hard surface, the piezoelectric vibrating piece 40 tends to pivot in the arrow direction (double-headed arrows) relative to a centerline G. The centerline G extends in the X-direction along the X-direction centerlines of the connecting portions 45. During such pivoting motion of the piezoelectric vibrating piece 40, the base 41 moves substantially in one X-direction as the vibrating arms collectively move in the opposite X-direction. (Pivoting of the vibrating arms 42 in the Y and −Y directions is not illustrated.)

The pivoting motion of the piezoelectric vibrating piece 40 can result in the base 41 contacting a movement buffer 46. Thus, the contacted movement buffer 46 prevents the pivoting base 41 from contacting the outer frame 21. If the base 41 were otherwise allowed to pivot sufficiently to contact the inside surfaces of the longitudinal edges of the frame, the resulting stress could cause fracture of the piezoelectric vibrating piece 40. Contact of the base 41 with either of the movement buffers 46 also limits pivoting of the vibrating arms 42 in Y and −Y directions.

The movement buffers 46 in this embodiment are located at respective positions that avoid their contacting the most distal portions of the base 41. If the most distal portions of the base were otherwise allowed to contact the movement buffers 46, the base 41 could be easily broken. Therefore, the movement buffers 46 can be located at any location along the inside edge of the frame except locations at which the buffers could be contacted by the most distal portions of the base 41.

FIG. 2B shows a movement buffer 46 in more detail. The inner edge surface 406 of the movement buffer 46 is not horizontal in the figure. Rather, the inner edge surface 406 desirably has a slope relative to the corresponding Y-direction line, taking into consideration the oscillation range of the base 41. Although the inner edge surface 406 can be parallel to the Y-axis, increased benefit of the movement buffer 46 is achieved by making the surface 406 parallel to the side-edge surface of the base 41 in contact with the surface 406, which provides the greatest surface area of contact of the base 41 with the surface 406 whenever the base 41 is pivoted sufficiently in the X and −X directions. I.e., with a sloped inner edge surface 406, the base 41 and surface 406 contact each other over the widest possible surface area, which disperses the forces of impact compared to an extension of which the surface 406 is not sloped. More dispersal of impact forces prevents fracture of the base 41 or movement buffer 46 otherwise caused by contact of the inner edge surface 406 with the edge surface of the base 41. This minimization of impact force is especially desirable during long-term contact. Also, the greater the magnitude of the impact force, the greater the beneficial effect of the sloped inner edge surface 406.

FIG. 2B details a representative "height" (X-direction dimension) of the trapezoidal movement buffer 46. The height is configured proportionally to the distance between the buffers 46 and the line G. In this embodiment, the movement buffers 46 have sloped inner edge surfaces 406, wherein H1 is the X-direction dimension of the inner edge of the outer frame 21 and the "highest" point of the buffer 46, and H2 is the X-direction dimension of the inner edge of the outer frame 21 and the "lowest" point of the buffer 46. The dimensions H1 and H2 are respectively proportional to the length L1 between the highest point and the line G, and the length L2 between the lowest point and the line G. Since L1<L2, then H1>H2. Whenever the piezoelectric vibrating device is pivoted in the X and −X directions, the range of pivoting motion of the vibrating arms of the piezoelectric vibrating piece 40 increases with increased distance from the line G.

The movement buffers 46 can be formed by etching, except in locations in which a wafer is normally etched. The buffers also can be formed by etching after forming protective film defining locations in which the buffers are to be formed. The buffers can be formed by any of various known techniques, the descriptions of which are omitted.

First and Second Alternative Configurations of the First Embodiment

Figure 3A:
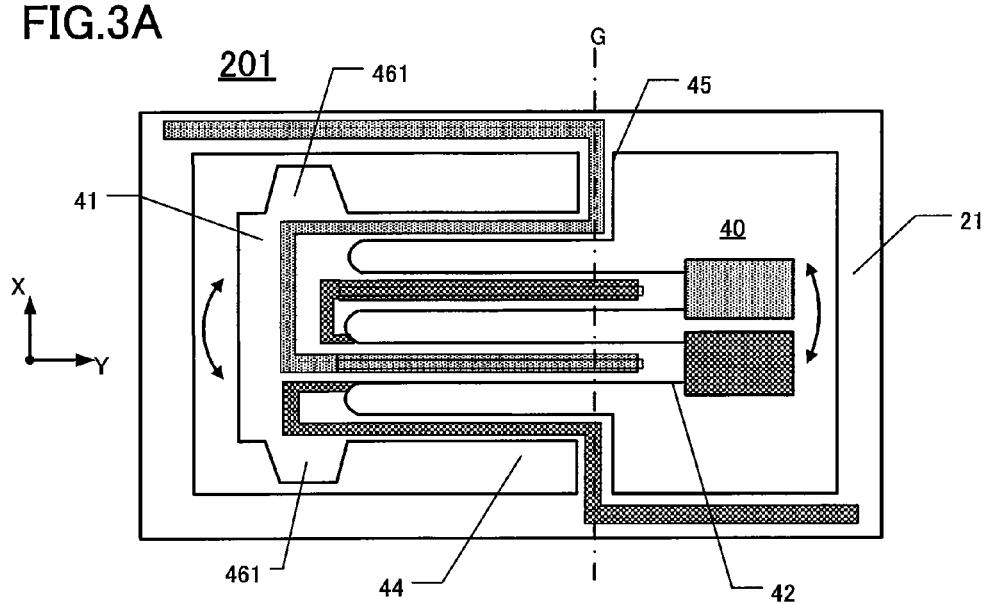
FIG. 3A is a plan view of the chip plate of a first alternative configuration of the first embodiment of a piezoelectric vibrator.
Figure 3B:
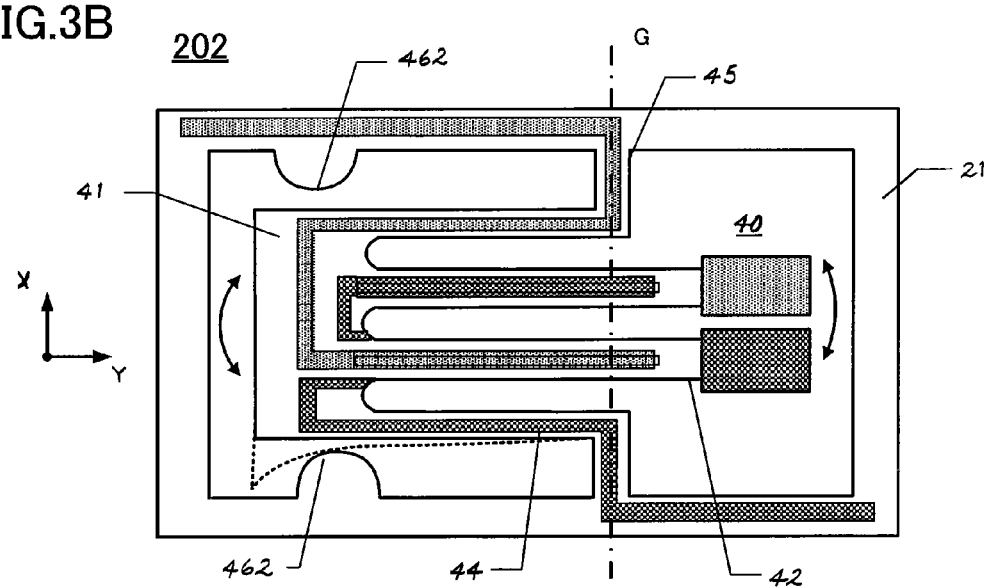
FIG. 3B is a plan view of the chip plate of a second alternative configuration of the first embodiment of a piezoelectric vibrator.

FIG. 3A is a plan view of the chip plate 201 of a first alternative configuration of a piezoelectric vibrating device. FIG. 3B is a plan view of the chip plate 202 of a second alternative configuration of a piezoelectric vibrating device.

In the first alternative configuration (FIG. 3A), the movement buffers 46 in the first embodiment are replaced with corresponding trapezoidal movement buffers 461 projecting in respective X-directions from the base 41 rather than from the outer frame 21. Thus, the chip plate 201 of FIG. 3A is different from that of the first embodiment 100. Specifically, in FIG. 3A the movement buffers 461 extend from respective edges of the base 41 rather than from respective inner edges of the outer frame 21. The buffers 461 can be situated on the most distal regions of the base 41. In the configuration shown in FIG. 3A the "height" (X-dimension) of the buffers 461 from the base 41 is proportional to the distance between the buffers 461 and the line G, as described above. Although the edge surface of each movement buffer 461 is horizontal in FIG. 3A, the edge surface alternatively can be sloped.

Since the trapezoidal movement buffers 461 project from the base 41, the base 41 has more mass than the configuration shown in FIG. 2A, all other parameters being equal. The increased mass of the base 41 desirably inhibits conduction of oscillation leakage to the exterior of the piezoelectric vibrator 100 and reduces the forces of physical impact imparted to the base when dropped.

In FIG. 3B, the movement buffers 462 are semicircular rather than trapezoidal (FIG. 2A). Also, the buffers 462 project (in the X-direction) from the inner edge of the outer frame 21 of the chip plate 202, rather than from the base (FIG. 3A). The "height" (X-dimension) of each movement buffer 462 is proportional to the distance between the buffer 462 and the line G, as described above.

Second Embodiment

Portions of this embodiment that are similar to corresponding portions of the first embodiment have the same respective reference numerals as in the first embodiment, and are not described further. Rather, the following description addresses the differences.

Figure 4A:
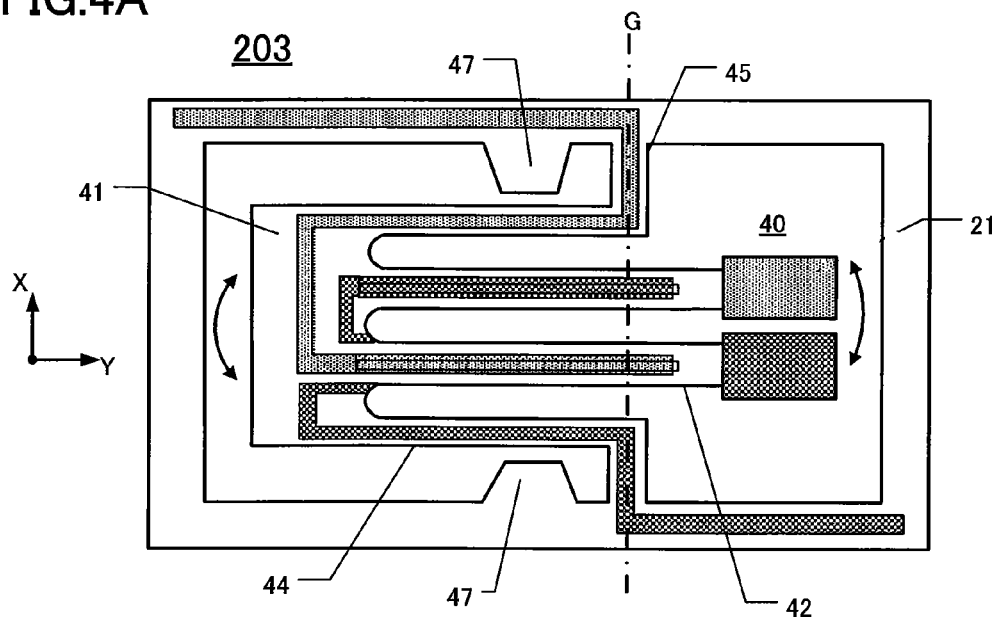
FIG. 4A is a plan view of the chip plate of a second embodiment of a piezoelectric vibrator.
Figure 4B:
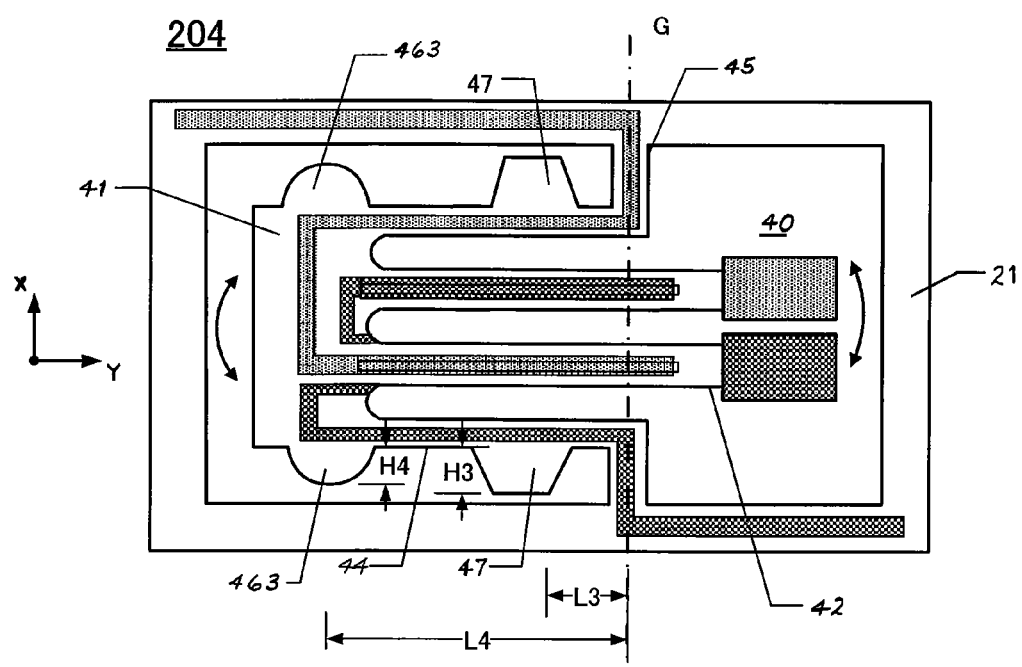
FIG. 4B is a plan view of the chip plate of an alternative configuration of the second embodiment of a piezoelectric vibrator.

FIG. 4A is a plan view of the chip plate 203 of this embodiment. FIG. 4B is a plan view of the chip plate 204 of an alternative configuration of the second embodiment. In FIG. 4A, trapezoidal movement buffers 47 extend, from the inner edges of respective regions of the outer frame 21, toward respective regions of the supporting arms 44. In the figure the distal edge surface of each movement buffer 47 is parallel to the corresponding edge surface of the respective supporting arm 44. Alternatively, the distal edge surface of each buffer 47 can be sloped in a manner similar to the movement buffers 46 shown in FIGS. 2A and 2B. The X-dimension of each trapezoidal buffer 47 desirably is within a range ensuring that the buffer does not interfere with regular oscillation of the piezoelectric vibrating piece 40. This dimension is proportional to the distance from the buffer to the centerline G.

The supporting arms 44 in this embodiment have reduced adverse influence on the vibration frequency or the CI value of the piezoelectric vibrating piece 40. The trapezoidal movement buffers 47 extend (in the X-direction) from corresponding locations on the outer frame 21 toward respective regions of the supporting arms 44. These locations are at predetermined distances in the longitudinal direction (Y-direction). Even if a supporting arm 44 acquires a chip from impact with a respective buffer 47, neither the vibration frequency nor the CI value of the piezoelectric vibrating piece 40 is significantly influenced. Since the movement buffers 47 are located near the centerline G, accelerations of the piezoelectric vibrating piece accompanying shock-induced movement of the vibrating piece 40 relative to the outer frame 21 are minimized. Thus, collision forces imparted to the buffers 47 are reduced in impact conditions.

In FIG. 4B the chip plate 204 of an alternative configuration of the second embodiment is shown. The depicted configuration includes trapezoidal movement buffers 47 extending toward the outer frame from corresponding locations on the supporting arms 44. The buffers 47 are substantially the same as respective movement buffers described above, so further explanations of same are omitted. In addition to the trapezoidal buffers 47, this configuration also includes semicircular movement buffers 463 that project from respective locations on the supporting arms near the base 41 toward the outer frame 21. Thus, the trapezoidal movement buffers 47 are adjacent (in the Y-direction) corresponding semicircular buffers 463. The semicircular buffers 463 are similar to the semicircular buffers 462 shown in FIG. 3B, except that, in FIG. 4B the movement buffers 463 extend from the base 41 instead of from the outer frame 21. Instead of the semicircular buffers 463, 462, buffers 46, 461 having a trapezoidal plan profile can be used.

In this embodiment, the height (X-dimension) H3 of the trapezoidal movement buffer 47 and the height (X-dimension) H4 of the semicircular buffer 463 are proportional to the length L3. The length L3 is the Y-direction length between the highest point of the buffer 47 and the centerline G, and the length L4 is the Y-direction length between the highest point of the buffer 463 and the centerline G. Since L3<L4, H3>H4. Whenever the piezoelectric vibrating piece 40 experiences shock-induced motion in the X and −X directions, different locations on the vibrating arms 42 move respective distances that are greater with increased distance from the centerline G.

Third Embodiment

In the following discussion of the third embodiment, components thereof that are similar to corresponding components of the second and first embodiments have the same respective reference numerals and are not described further.

Figure 5A:
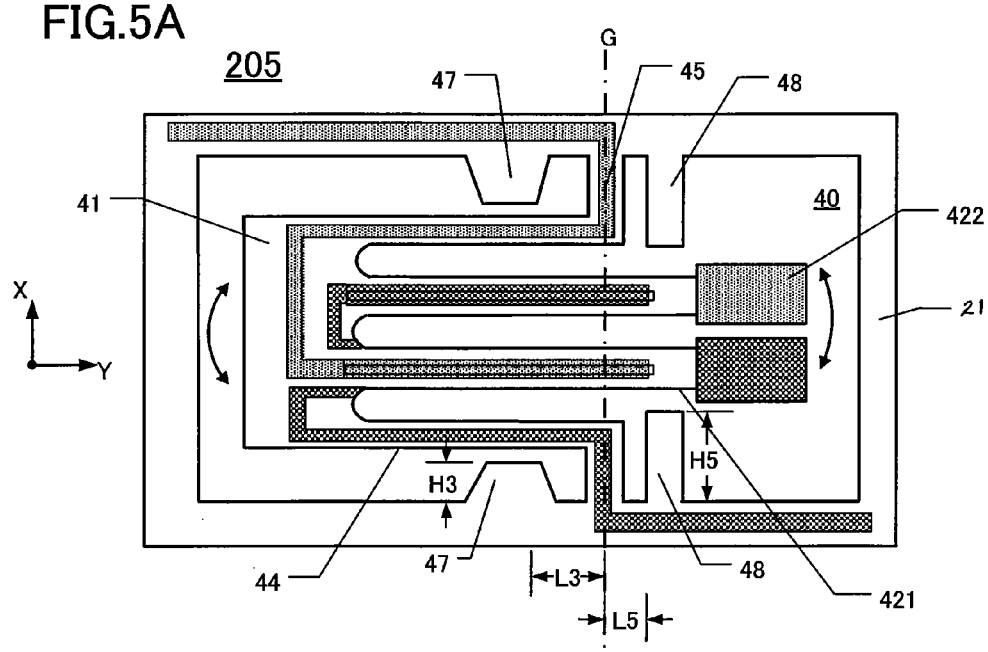
FIG. 5A is a plan view of the chip plate of a third embodiment of a piezoelectric vibrator.
Figure 5B:
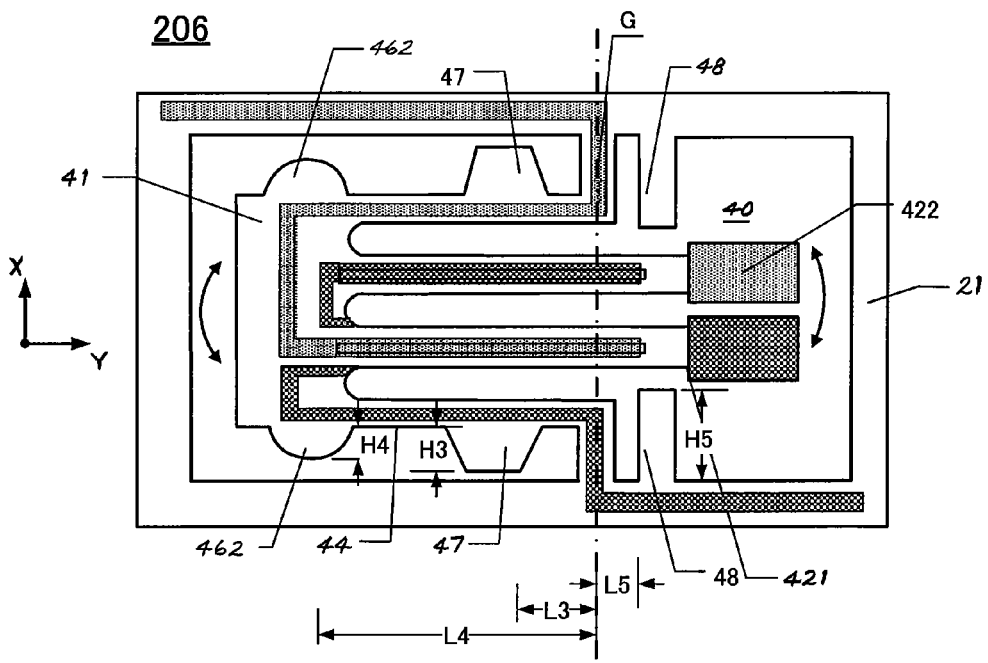
FIG. 5B is a plan view of the chip plate of an alternative configuration of the third embodiment of a piezoelectric vibrator.
Figure 6:
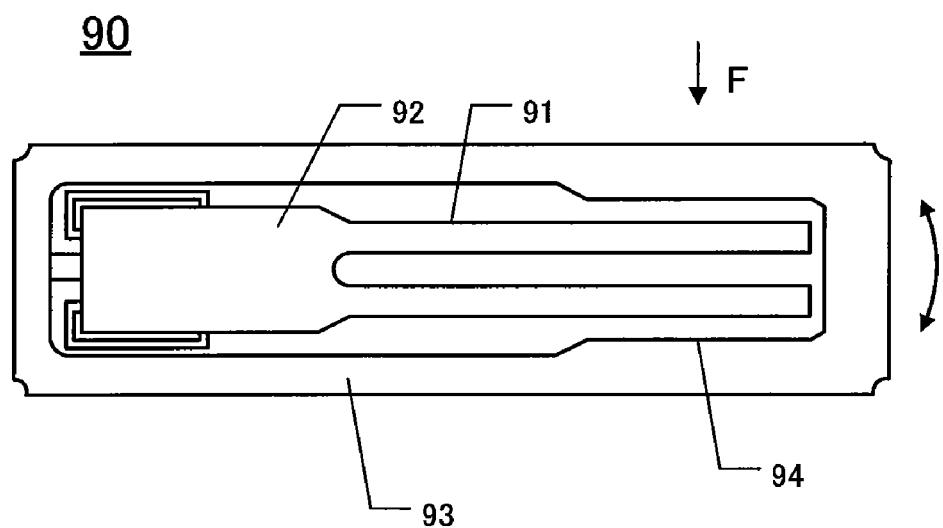
FIG. 6 is a plan view (and partial section) of a conventional piezoelectric device 90.

FIG. 5A is a plan view of a chip plate 205 of this embodiment of a piezoelectric vibrator. FIG. 5B is a plan view of a chip plate 206 of an alternative configuration of the third embodiment. The chip plate 205 includes an outer frame 21. As shown in FIG. 5A, rectangular movement buffers 48 extend in respective X-directions from respective inner edges of the frame 21 toward respective vibrating arms 421. The length of each extension 48 in the X-direction desirably is in a range in which the buffers 48 do not interfere with regular oscillation of the piezoelectric vibrating piece 40. These lengths can be expressed as respective proportions of the Y-direction distance from the extension to the centerline G.

FIG. 5A also includes trapezoidal movement buffers 47 as in the embodiment shown in FIG. 4A. The "height" (X-direction dimension) H3 of each buffer 47 is proportional to the distance L3 from the "highest" point of the buffer 47 to the centerline G. Similarly, the "height" (X-direction dimension) H5 of each buffer 48 is proportional to the distance L5 from the "highest" point of the buffer 48 to the centerline G. Since L3>L5, then H3<H5. Whenever the vibrating arms 421 experience shock- or impact-induced motion in the X and −X directions, the motion occurs over a distance that is greater with increased distance from the centerline G.

The vibrating-arm movement buffers 48 are located at respective designated distances from the hammer-head portions 422. Consequently, the buffers 48 can have an effect on the vibration frequency or CI value of the piezoelectric vibrating piece 40 and may be prone to chipping upon impact with vibrating arms. Nevertheless, the movement buffers 48 protect the hammer-head portions 422 and prevent their breakage when impacted. Since impact-produced accelerations are lower with less distance of the vibrating arms to the centerline G, the buffers 48 reduce forces with which the vibrating arms 421 collide against the extensions, compared to the force of collisions of the piezoelectric vibrating piece with buffers 46.

As shown in FIG. 5B, the chip plate 206 of the alternative configuration comprises movement buffers 462 extending in respective X-directions from the base 41, similar to the second alternative configuration of the first embodiment. The buffers 46 extending from the base 41 of the first embodiment 100 or the buffers 461 in the first alternative configuration alternatively can be formed. The buffers 47 extending in the X-directions from the supporting arms can also be formed, as shown in FIG. 5B. The buffers can be formed with any combination as necessary.

The "height" of each vibrating-arm movement buffer 48 can be configured with the consideration of expected impact-related motions of the hammer-head portions 422.

Also considered is the proportion of distance from the vibrating-arm movement buffer 48 to the center line G as described above. In this embodiment, the "height" H5 (nearest the centerline G) of the buffers 48, the "height" H3 (nearest the centerline G) of the buffers 47, and the "height" H4 of the buffers 463 are proportional to the length L5 (between the highest point of the buffers 48 and the centerline G), the length L3 (between the highest point of the buffers 47 and the centerline G), and the length L4 (between the highest point of the buffers 463 and the centerline G), respectively. The lengths L5, L3, and L4 are reduced in series as the heights H5, H3, and H4, respectively, are increased in series. Thus, whenever the piezoelectric vibrating piece 40 experiences motion (in the X and −X directions) caused by physical impact, the respective ranges of motion at various locations on the vibrating arms 421 increase with increased distance of the locations from the centerline G.

The "height" (X-direction dimension) of the movement buffers 48 limiting motion of the vibrating arms is proportional to the distance between the centerline G and the "high" point of the buffer 48 closest to the line G. This proportion is greater than the proportion of the length between the "high" point of the buffer 47 and the line G or the distance between the "high" point of the buffer 463 and the line G. This is because the distance between the vibrating arm 42 and the outer frame 21 is greater than the distance between the supporting arm 44 and the outer frame 21.

An advantage of this embodiment is that collision of the hammer-head portion 422 (which is easily chipped) and the most distal portion of the base 41 is readily and reliably prevented. Consequently, fracture of the vibrating device upon receiving a physical shock is reduced. Also reduced are shock-induced changes in vibrating frequency.

Piezoelectric devices encompassed by the invention are described above in connection with several embodiments. However, it will be understood that the invention is not limited to the described embodiments. It will be obvious to persons of ordinary skill in the relevant art to modify the invention based on this disclosure. For example, the extensions can be formed of the same material as the lid 10 and package base 30. Alternatively, the movement buffers can be formed of a cushioning material applied to a frame, base, or supporting arm using an adhesive or the like. Also, in the described embodiments, the chip plate 20 including piezoelectric vibrating piece and outer frame is sandwiched between the lid and package base to form a "package."

Alternatively, any of various conventional packaging schemes can be used in which the piezoelectric vibrating piece is mounted in a package and sealed by a lid or the like. In this manner, cushioning materials can be formed on interior surfaces of the package.

What is claimed is:

1. A piezoelectric device, comprising:
   a lid plate;
   a chip plate comprising a tuning-fork type piezoelectric vibrating piece and an outer frame surrounding the tuning-fork type piezoelectric vibrating piece; and
   a package base plate, wherein the lid plate, chip plate, and package base plate are bonded together as a package containing the piezoelectric vibrating piece inside the package;

wherein the tuning-fork type piezoelectric vibrating piece comprises a base having an X-direction width and at least a pair of vibrating arms extending in a Y-direction from the base;

the tuning-fork type piezoelectric vibrating piece is coupled to the outer frame by a pair of supporting arms situated outboard of the vibrating arms;

the outer frame includes an inner edge surface, extending in the Y-direction, from which at least one base-movement buffer extends in the X-direction toward the base, the base-movement buffer having a height in the X-direction.

2. The piezoelectric device of claim 1, wherein the base-movement buffer is situated at a location on the inner edge surface selected to prevent distal-most regions of the base from colliding with the base-movement buffer.

3. The piezoelectric device of claim 1, further comprising a supporting-arm-movement buffer having a constant height in the X-direction, the supporting-arm-movement buffer extending from a location on the inner edge surface of the outer frame toward a respective supporting arm.

4. The piezoelectric device of claim 3, wherein the height of the base-movement buffer in the X-direction is proportional to a distance from the base-movement buffer to a connecting point of the tuning-fork type piezoelectric vibrating piece and the outer frame.

5. The piezoelectric device of claim 1, further comprising a supporting-arm movement buffer having a constant height in the X-direction, the supporting-arm-movement buffer extending from a location on an edge surface of the respective supporting arm toward the inner edge surface of the outer frame.

6. The piezoelectric device of claim 5, wherein the height of the base-movement buffer and the height of the supporting-arm-movement buffer in the X-direction are proportional to a distance from the base-movement buffer and the supporting-arm-movement buffer to a connecting point of the tuning-fork type piezoelectric vibrating piece and the outer frame.

7. The piezoelectric device of claim 1, further comprising a supporting-arm-movement buffer having a constant height in the X-direction, the supporting-arm-movement buffer extending from a location on the inner surface of the outer frame toward a respective supporting arm.

8. The piezoelectric device of claim 7, wherein the base-movement buffer has a height in the X-direction that is proportional to a distance from the base-movement buffer to a point of connection of the tuning-fork type piezoelectric vibrating piece and the outer frame.

9. The piezoelectric device of claim 7, wherein the base-movement buffer is situated at a location on the inner edge surface selected to prevent distal-most regions of the base from colliding with the base-movement buffer.

10. The piezoelectric device of claim 1, further comprising a vibrating-arm-movement buffer having a constant height in the X-direction, the vibrating-arm-movement buffer extending from a location on the inner surface of the outer frame toward a respective vibrating arm.

11. The piezoelectric device of claim 1, wherein the base-movement buffer has a trapezoidal or a semicircular plan profile.

12. A piezoelectric device, comprising;
a lid plate;
a chip plate comprising a tuning-fork type piezoelectric vibrating piece and an outer frame surrounding the tuning-fork type piezoelectric vibrating piece; and
a package base plate, wherein the lid plate, chip plate, and package base plate are bonded together as a package containing the piezoelectric vibrating piece inside the package;

wherein the tuning-fork type piezoelectric vibrating piece comprises a base having an X-direction width and at least a pair of vibrating arms extending in a Y-direction from the base;

the tuning-fork type piezoelectric vibrating piece is coupled to the outer frame by a pair of supporting arms situated outboard of the vibrating arms;

the base includes a side edge surface from which at least one base-movement buffer extends in the X-direction toward the outer frame, the base-movement buffer having a height in the X-direction.

13. The piezoelectric device of claim 12, further comprising a supporting-arm-movement buffer having a constant height in the X-direction, the supporting-arm-movement buffer extending from a location on the inner surface of the outer frame toward a respective supporting arm.

14. The piezoelectric device of claim 13, wherein the height of the base-movement buffer and the height of the supporting-arm-movement buffer in the X-direction are proportional to a distance from the base-movement buffer and the supporting-arm-movement buffer to a connecting point of the tuning-fork type piezoelectric vibrating piece to the outer frame.

15. The piezoelectric device of claim 12, further comprising a supporting-arm-movement buffer having a constant height in the X-direction, the supporting-arm-movement buffer extending from a location on an edge surface of the respective supporting arm toward the inner edge surface of the outer frame.

16. The piezoelectric device of claim 15, wherein the base-movement buffer has a height in the X-direction that is proportional to a distance from the base-movement buffer to a connecting point of the tuning-fork type piezoelectric vibrating piece to the outer frame.

17. The piezoelectric device of claim 12, further comprising at least one supporting-arm-movement buffer having a constant height in the X-direction extending from an inner edge surface of the outer frame toward an edge surface of a respective supporting arm.

18. The piezoelectric device of claim 17, wherein the base-movement buffer has a height in the X-direction that is proportional to a distance from the base-movement buffer to a connecting point of the tuning-fork type piezoelectric vibrating piece to the outer frame.

19. The piezoelectric device of claim 12, further comprising a vibrating-arm-movement buffer having a constant height in the X-direction, the vibrating-arm-movement buffer extending from a location on the inner surface of the outer frame toward a respective vibrating arm.

20. The piezoelectric device of claim 12, wherein the base-movement buffer has a plan profile that is either trapezoidal or semicircular.

* * * * *